United States Patent [19]

Hacke et al.

[11] 4,268,349
[45] May 19, 1981

[54] PROCESS FOR THE PRODUCTION OF PRINTED CIRCUITS WITH SOLDER REJECTING SUB-ZONES

[75] Inventors: Hans-Juergen Hacke; Hans Hadersbeck, both of Munich, Fed. Rep. of Germany

[73] Assignee: Siemens Aktiengesellschaft, Berlin & Munich, Fed. Rep. of Germany

[21] Appl. No.: 723,582

[22] Filed: Sep. 15, 1976

[30] Foreign Application Priority Data

Sep. 16, 1975 [DE] Fed. Rep. of Germany ....... 2541280

[51] Int. Cl.³ ............................................. H05K 3/06
[52] U.S. Cl. ................................ 156/656; 156/661.1; 156/664; 156/666; 156/901; 204/15; 204/23; 204/32 R; 204/38 S; 427/258; 427/272; 427/307
[58] Field of Search ............... 156/230, 632, 634, 901, 156/902, 656, 661.1, 664, 666; 427/98, 258, 272, 282, 307; 204/15, 23, 32 R, 38 S, 35 R, 54 R; 29/625, 627; 228/118, 180 A; 96/36.2

[56] References Cited

U.S. PATENT DOCUMENTS

| | | | |
|---|---|---|---|
| 3,443,988 | 5/1969 | McCormack et al. | 427/258 |
| 3,599,326 | 8/1971 | Direnzo | 228/118 |
| 3,610,811 | 10/1971 | O'Keefe | 29/626 |
| 3,691,632 | 9/1972 | Smith | 29/625 |
| 3,702,284 | 11/1972 | Merkenschlager | 204/15 |
| 3,754,324 | 8/1973 | Krehbiel et al. | 29/626 |
| 3,945,826 | 3/1976 | Freidman et al. | 204/32 R |
| 3,990,982 | 11/1976 | Dixon | 156/664 |

FOREIGN PATENT DOCUMENTS 2140274 8/1971 Fed. Rep. of Germany ...... 228/118

Primary Examiner—Jerome W. Massie
Attorney, Agent, or Firm—Hill, Van Santen, Steadman, Chiara & Simpson

[57] ABSTRACT

A process for the production of printed circuit boards having first zones of a wiring pattern for receiving solder and second sub-zones provided with solder rejecting properties so that they do not receive solder, characterized by galvanically applying a solderable etch-resistant metal layer on the first sub-zones of each conductive metal layer, by photo printing a mask of etch-resistant material on the second sub-zones, etching to remove the exposed portions of the conductive metal layer, removing the mask from the second sub-zones and providing the exposed second sub-zones with a solder rejecting property with the aid of passivation without impairing the solderability of the etch-resistant metal layers of the first sub-zones.

4 Claims, 6 Drawing Figures

4,268,349

PROCESS FOR THE PRODUCTION OF PRINTED CIRCUITS WITH SOLDER REJECTING SUB-ZONES

BACKGROUND OF THE INVENTION

1. Field of the Invention

The present invention is directed to a process which includes etching for the production of printed wiring or circuit boards in which sub-zones of the circuit or wiring pattern which are not to receive solder are provided with solder rejecting properties by means of passivation.

2. Prior Art

In previously used methods of soldering a printed circuit board, sub-zones of the wiring or circuit pattern, which are not to receive any solder, are covered with a solder stop lacquer. This is not only to save solder but also to prevent the danger of short-circuits due to the formation of solder bridges. The application of the solder stop lacquer in the form of a solder stop mask is normally carried out by a silk screen printing process, which, due to its poor resolution capacity, imposes a limit on a precisely fitting coordination between the printed image and the wiring structure or pattern. Therefore, the known methods of using solder stop lacquers are not suitable for circuit boards wih fine wiring structures or patterns.

The known processes have suggested providing the sub-zones of the wiring or circuit pattern, which sub-zones are not to receive any solder, with a solder rejecting property by passivation. To obtain this end, the wiring pattern is completely formed and then the entire board with the exception of those sub-zones of the wiring pattern or circuit pattern, which zones are not to receive any solder, is provided with a photo lacquer mask by a photo printing method. Subsequently, the sub-zones which are not covered by the photo lacquer are provided with a passivation layer. The high resolution capacity of the photo printing process facilitates an application of the passivation layer in precise locations. In a variant of this known process, the whole metal surface on the substrate is passivated and then those zones which are to form the solder rejecting regions of the wiring patterns after the etching step are covered wih a photo lacquer. The portions of the passivation layer, which are not covered with the photo lacquer, are then removed chemically and the wiring or circuit pattern is then produced in a known manner such as by masking and etching. However, since both cases require a special covering mask which is applied by a photo printing method, the application of the passivation layer is very expensive. In addition, the solderability of the solderable zones of the wiring or circuit pattern can be considerably impaired due to an oxide formation which, in particular, occurs when the circuit boards are subject to a long intermediate storage time. However, it is not possible to remove the oxide layers either chemically or mechanically as the solder rejecting passivation layer would also be removed or damaged as a consequence of the chemical or mechanical removal of the oxide layer.

SUMMARY OF THE INVENTION

The present invention is directed to an improved process so that the passivation layer can be applied without a special outlay and the solderability of the solderable zones of the wiring or circuit pattern are retained even after long periods of storage.

To accomplish this task, the invention is directed to a process for the production of printed circuit boards having first sub-zones of a wiring pattern for receiving solder and second sub-zones provided with solder rejecting properties so they do not receive solder. The process includes providing a workpiece comprising a substrate with a conductive metal layer on at least one surface, and etching each of the layers to form the desired wiring pattern with the improvement comprising prior to the step of etching, galvanically applying a solderable, etch-resistant metal layer to the first sub-zones of each of the conductive metal layers and photo printing a mask of etch-resistant material of the second sub-zones of each of the conductive metal layers, and subsequent to the etching step, removing the etch-resistant material from the second sub-zones are providing the exposed second sub-zones with a solder rejecting property by the aid of passivation without impairing the solderability of the etch-resistant metal layers of the first sub-zones.

The second sub-zones of the wiring or circuit pattern which are not to receive any solder, for example the conductive paths, are coated with a resistant passivation layer which prevents wetting of the second sub-zones with solder whereas the first sub-zones, such as solder lugs and through contacts, are covered with a corrosion-resistant metal layer which remains satisfactorily solderable. Since the passivation means has a selective action, the solderable sub-zones of the circuit pattern do not require a cover or mask during the application of the passivation layer. The galvanic application of the etch-resistant metal layer, as a condition for selective passivation, is included into the process step for the production of the wiring without any additional expenses, which are worthy of note. For example, the step of galvanic metal deposition is always required for the production of the through contacts.

Preferably, the improvement includes applying a positively acting photo layer on the entire surface of each conductive metal layer. The positive acting photo layer is subjected to a first exposure and development process to produce a galvanic mask which is used during the galvanic application of the etch-resistant metal in the first sub-zones. After the galvanization, the remainder of the positive acting photo layer is subjected to a second exposure and development process to produce the etching mask. Thus, just one single photo layer is required for the formation of both the galvanic mask and etching mask and thus the process further reduces the outlay for the production of the printed circuit or wiring.

Advantageously, the wiring is etching out of a copper surface and the zones, which are to receive the solder, are reinforced by the etch-resistant metal layer which is a material selected from a group consisting of tin and tin-lead.

A particularly suitable step of passivation is by dipping the entire workpiece comprising an insulated board with the copper layers into an aqueous solution of liver of sulfur, which is a mixture of potassium polysulfide and potassium thiosulfate. The liver of sulfur solution facilitates an economically and extremely effective passivation within a few minutes and also exhibits satisfactory properties with respect to electrolyte corrosion.

DESCRIPTION OF THE PREFERRED EMBODIMENT

Figure 6:
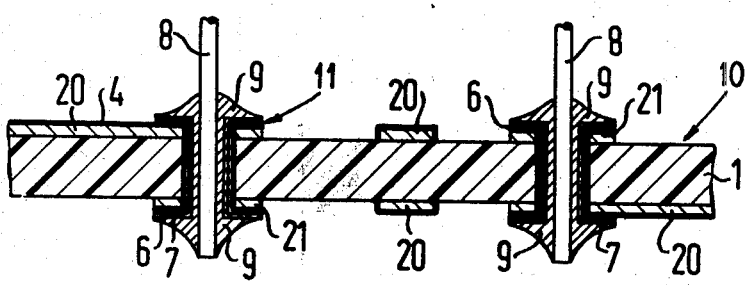

The principles of the present invention are particularly useful for forming a printed circuit or wiring board generally indicated at 10 in FIG. 6. The printed circuit board 10 has a circuit or wiring pattern on each of the opposite surfaces of an insulating plate or substrate 1 and has through contact or connections 11 extending between the two patterns which are separated by the substrate 1.

Figure 1:
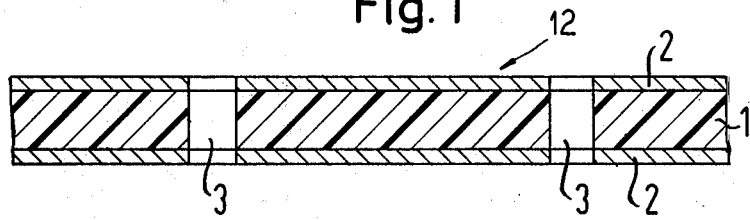
FIGS. 1-6 are cross-sectional views illustrating successive stages of the production of a double sided through-contacted printed circuit board having solder rejecting sub-zones in accordance with the present invention.

To form the circuit board 10, the process begins by providing a workpiece generally indicated at 12 in FIG. 1. The workpiece 12 comprises the insulating plate or substrate 1 which has a copper foil 2 laminated to each of the opposite surfaces and is provided with bores 3 at the points or locations at which through contacts 11 are to be formed.

Figure 2:
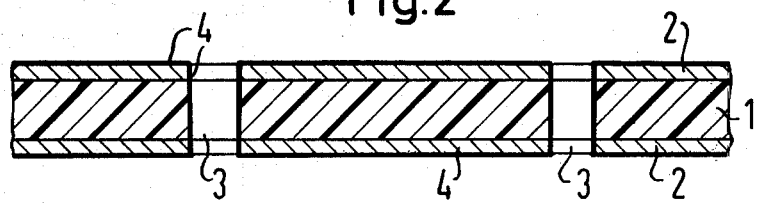

All surfaces of the workpiece 12 including the walls of bores 3 are provided with a copper layer 4 having a total thickness of approximately 5 μm as illustrated in FIG. 2. The copper layer 4 is provided by a currentless and galvanic copper deposition.

Figure 3:
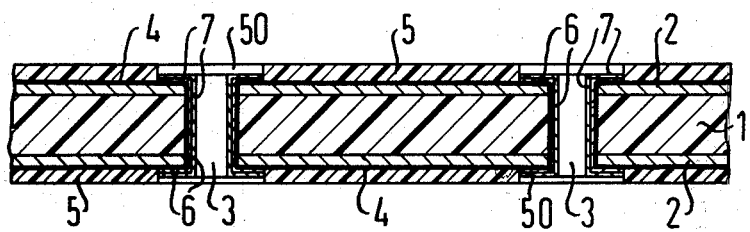

After providing the copper layer 4, both surfaces of the workpiece 11 are provided with a layer or coating 5 of a photo lacquer which has a positive action. After providing the layers 5 of photo lacquer, the layers 5 are subjected to a first exposure and development process to remove portions or zones 50 (FIG. 3) which are located at bores 3 and correspond to the position of later formed through contacts 11 and soldering lugs 21 (FIG. 6). The remaining portions of the photo lacquer layers 5 form galvanic masks which covers the copper layers 4 except at exposed zones 50.

The galvanic metal, which is galvanically deposited in the zones 50, is applied in two separate layers. A first layer 6 of copper has an approximate thickness of 35 μm and is followed by a subsequent metal layer 7 having a thickness of at least 15 μm. The layer 7 for example is of a material selected from a group consisting of tin and tin-lead.

Figure 4:
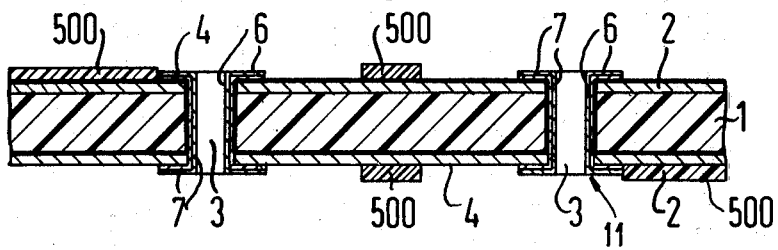

After the galvanization, which applies the layers 6 and 7, the photo lacquer layers 5 are subject to a second exposure and development process so that only the zones 500 remain on the plate (see FIG. 4). These zones 500 form an etching mask which protects portions of the layers 2 and 4 which will later form the conductive path after a subsequent etching step.

Figure 5:
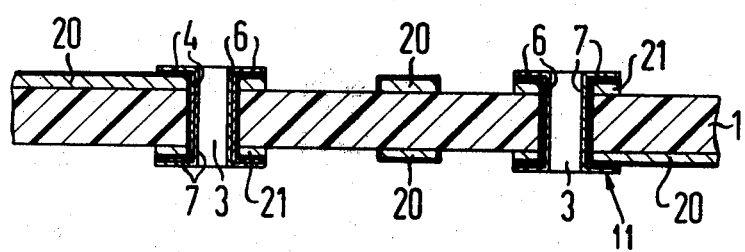

After etching the exposed portions of the copper layers 2 and 4, the etching mask 500 is removed to leave the conductive paths 20 (FIG. 5). The etching away of the undesired zones of the copper foil 2 is effected by an etching agent having a selective action. For example, an ammoniacal sodium chlorite etching solution is used and does not attack the metal layer 7 so that the conducting paths 20 and the solder lugs 21 remain on the insulating plate 1. The conducting paths 20 are passivated by submerging the entire workpiece 12 for approximately 5 minutes into a solution containing approximately 2.5 g liver of sulfur, which is a mixture of potassium polysulfides and potassium thiosulfate, per liter of tap water. When the solution is maintained at room temperature, a thin copper sulfide layer is formed on the surface of the conductor paths 20, which are the second sub-zones of the patterns, while the tin or tin-lead metal layers 7, which are the first sub-zones, are not changed by this solution. This copper sulphide layer (not illustrated) has a solder rejecting property and also exhibits satisfactory characteristics with respect to the electrolyte corrosion.

When a component having leads such as 8 (FIG. 6) is soldered to the circuit board 10, the connecting wires or leads 8 are inserted in the through contacts 11 and a solder connection is formed by solder 9 extending between the layer 7 of the contact 11 and on the solder lugs 21 which layer 7 is wetted with the solder 9. It is noted that the solder will not wet the conductors 20 which are provided with the copper sulphide passivation layer.

In addition to the above-mentioned aqueous solution of liver of sulfur, which is known as a metal coloring solution for copper and copper alloys, it is also possible to use other passivation means, in particular different copper coloring solutions which will provide a copper or copper alloy with a solder rejecting property and do not impair the solderability of the tin or tin-lead layer 7.

Although various minor modifications may be suggested by those versed in the art, it should be understood that we wish to employ within the scope of the patent warranted hereon, all such modifications as reasonably and properly come within the scope of our contribution to the art.

With regard to the two exposures of the photo layers 5 a positively acting photo lacquer which only can be exposed by light of certain wave lengths, for example by ultraviolet light, is used. A suitable photo lacquer which only can be exposed by ultraviolet light is for example the commercial produce AZ 111 produced by the firm of Shipley Europe Ltd. Coventry, England. To prevent exposing of the layers 5 between the first and the second exposing step, the galvanic deposition of the layers 6 and 7 is conducted under an illumination without any component of the wavelengths needed for the exposure of the photo lacquer. An illumination without any ultraviolet component may be obtained by transparent yellow foils, being not transparent to ultraviolet light, which are arranged before the windows and before the illuminating equipment.

A particularly suitable passivation will be obtained by dipping the workpiece 12 in commercially available metal coloring solutions for copper and copper alloys, which form a thin copper sulfide layer on the surface of the conductor paths 20. Such metal coloring solutions are described in the 44th Metal Finishing Guidebook Directory for 1976, published by Metals and Plastic Publications, Inc., U.S.A., page 494. For example the workpiece 12 is immersed at room temperature in the solution of ¼ oz/gal liver of sulfer or liquid polysulfide. Colors will progress through the spectrum from yellow to dark purple to black. The strength of the solution should be such that the black color forms in about 1 minute. If it forms much more rapidly, the copper sulfide film will be brittle and non-adherent, and the concentration should be reduced.

Liver of sulfer may be produced by melting a mixture of 1 part of sulfur and 2 parts of potassium carbonate at a temperature of about 250° C. under exclusion of air. The resulting liver of sulfur is a mixture of potassium polysulfide, potassium sulfate and potassium thiosulfate.

We claim:

1. In a process for the production of a printed circuit board having first sub-zones of a wiring pattern for receiving solder and second sub-zones provided with a solder rejecting property so that they do not receive solder, said process including providing a workpiece comprising a substrate with a conductive metal layer on at least one surface, etching each of the layers to form the desired wiring pattern, the improvement comprising prior to the step of etching, applying a positively acting photo layer on each of the conductive metal layers, subjecting each of the photo layers to a first exposure and development process to expose the first sub-zones of each of the conductive metal layers, then galvanically applying a solderable, etch-resistant metal layer onto the exposed first sub-zones of each of the conductive metal layers, subsequently subjecting each of the photo layers to a second exposure and development process to produce an etching mask of a pattern of the second sub-zones on each of the conductive metal layers, and subsequent to the etching step, removing each of the etching masks from the second sub-zones and dipping the workpiece in an aqueous solution of liver of sulfur to form a passivation layer with a solder rejection property on each of exposed second sub-zones without impairing the solderability of the etch-resistant metal layer of the first sub-zone.

2. In a process according to claim 1 wherein each of the conductive metal layers is a copper layer and wherein the etch-resistant metal layer is selected from a group consisting of tin and tin-lead.

3. A process for the production of a printed circuit board having wiring patterns having first sub-zones for receiving solder and second sub-zones which are not to receive solder, said process comprising the steps of providing a workpiece comprising a substrate with a conductive metal layer on an exposed surface; applying a positive acting photo layer onto each of the conductive metal layers; subjecting each of the positive acting photo layers to a first exposure and development to expose each of the conductive metal layers in the areas of the first sub-zones; galvanically applying a solderable, etch-resistant metal layer in the exposed first sub-zones; subjecting the photo layer to a second exposure and development to form an etching mask of a pattern of the second sub-zone; etching the exposed portions of each of the conductive metal layers to remove the exposed portions, removing the etching mask, dipping the workpiece into a solution to render the surfaces of the second sub-zones solder rejecting with the aid of passivation without impairing the solderability of the etch-resistant metal layers of the first sub-zones.

4. A process according to claim 3, wherein the conductive metal layer is copper, the etch-resistant metal layer is of a material selected from a group consisting of tin and tin-lead and the solution is an aqueous solution of liver of sulfur.

* * * * *